United States Patent
Hsieh

(10) Patent No.: US 7,834,596 B2
(45) Date of Patent: Nov. 16, 2010

(54) ANALOG POWER-SAVING APPARATUS AND METHOD THEREOF FOR SHARING ELECTRIC CHARGES

(75) Inventor: Jin-Sheng Hsieh, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 416 days.

(21) Appl. No.: 12/018,211

(22) Filed: Jan. 23, 2008

(65) Prior Publication Data
US 2009/0102293 A1 Apr. 23, 2009

(30) Foreign Application Priority Data
Oct. 22, 2007 (TW) .............................. 96139463 A

(51) Int. Cl.
*H02J 7/00* (2006.01)
(52) U.S. Cl. ..................................................... 320/166
(58) Field of Classification Search ................. 320/166, 320/167; 327/536, 538
See application file for complete search history.

(56) References Cited

U.S. PATENT DOCUMENTS 6,400,211 B1 * 6/2002 Yokomizo et al. ............ 327/536
2006/0139017 A1 * 6/2006 Peiffer et al. ................. 323/282

* cited by examiner

*Primary Examiner*—Bao Q Vu
*Assistant Examiner*—Jue Zhang
(74) *Attorney, Agent, or Firm*—Jianq Chyun IP Office

(57) ABSTRACT

An analog power-saving apparatus and a method thereof for sharing electric charges enable the application device to entirely achieve power-saving goal by using an analog judgment mechanism. According to the judgment mechanism, in a duration when the energy-storing unit must distribute the stored electric charges to the load capacitor and an amount of the electric charges stored in the energy-storing unit is less than an amount of the electric charges stored in the load capacitor, the path for the energy-storing unit to distribute electric charges to the load capacitor is blocked; and after the load capacitor releases the electric charges thereof to the energy-storing unit for storage, the electric charges stored in the load capacitor after discharge are controlled to be not less than an amount of the electric charges stored in the energy-storing unit after storage.

15 Claims, 6 Drawing Sheets

US 7,834,596 B2

ANALOG POWER-SAVING APPARATUS AND METHOD THEREOF FOR SHARING ELECTRIC CHARGES

CROSS-REFERENCE TO RELATED APPLICATION

This application claims the priority benefit of Taiwan application serial no. 96139463, filed on Oct. 22, 2007. The entirety of the above-mentioned patent application is hereby incorporated by reference herein and made a part of this specification.

BACKGROUND OF THE INVENTION

1. Field of the Invention

The present invention generally relates to a power-saving apparatus and a method thereof for sharing electric charges, and more particularly, to an analog power-saving apparatus and a method thereof for sharing electric charges.

2. Description of Related Art

In general, an analog circuit employs an operational amplifier (OPA) to drive a load capacitor to provide a required output voltage available for an application circuit. FIG. 1 is a conventional circuit diagram showing an OPA 101 is used to drive a load capacitor $C_L$, wherein the positive input terminal (+) of the OPA 101 is for receiving an analog voltage $V_{DAC}$ generated by a digital code DS received by a digital-to-analog converter (DAC) 103, and the output terminal of the OPA 101 connects the negative input terminal (−) thereof to together form a unit gain amplifier so as to drive the load capacitor CL and thereby provide an output voltage $V_{OUT}$ available for a needed application device.

FIG. 2 is a signal waveform diagram of the analog voltage $V_{DAC}$ and the output voltage $V_{OUT}$ in FIG. 1. Referring to FIGS. 1 and 2, it can be seen from FIG. 2 in a duration $T_1$ where the analog voltage $V_{DAC}$ steeply rises from a low voltage level to a high voltage level, the OPA 101 charges the load capacitor $C_L$, and the duration $T_1$ would cause a power consumption of the above-mentioned application device. On the other hand, in a duration $T_2$ where the analog voltage $V_{DAC}$ steeply falls from the high voltage level to the low voltage level, the electric charges stored in the load capacitor $C_L$ would be discharged through the OPA 101, so that the output voltage $V_{OUT}$ also falls from the high voltage level to the low voltage level, and, thus, the duration $T_2$ does not cause any power consumption of the above-mentioned application device.

Based on the above description, some analog circuit designers proposed a power-saving method for sharing electric charges that recycling the above-mentioned released electric charges, then distributing the recycled released electric charges to the load capacitor $C_L$ during the output voltage $V_{OUT}$ rises again from the low voltage level to the high voltage level, further using the OPA 101 to drive the load capacitor $C_L$ with released electric charges from distributing, so as to establish a power-saving mechanism for the application device.

FIG. 3 is a circuit diagram of a conventional power-saving apparatus 300 commonly used for sharing electric charges and FIG. 4 is a signal waveform diagram of the analog voltage $V_{DAC}$ and the output voltage $V_{OUT}$ of the power-saving apparatus 300 for sharing electric charges in FIG. 3 including the control signals CS1 and CS2 of two switches SW1 and SW2 thereof. Referring to FIGS. 3 and 4, the digital system of the above-mentioned application device usually is informed of the status of the digital code DS received by the DAC 103 during each of durations $T_{P1}$-$T_{P3}$.

First in the duration $T_{P1}$, the digital system of the above-mentioned application device is informed of that the status of the digital code DS received by the DAC 103 in the entire duration $T_{P1}$ is the analog voltage $V_{DAC}$ in the high voltage level; thus, the digital system of the above-mentioned application device would send out the control signals CS1 and CS2 in the duration $T_1$ so as to turn off the switch SW1 and turn on the switch SW2. At the time, the electric charges in a storing/sharing capacitor $C_{EQ}$ stored prior to the duration $T_1$ would be distributed to the load capacitor $C_L$. It can be seen before an OPA 201 is used to drive the load capacitor $C_L$, the voltage across both terminals of the load capacitor $C_L$ has the voltage level of the sharing voltage $V_{EQ}$ of the storing/sharing capacitor $C_{EQ}$ already.

Next, the digital system of the above-mentioned application device would send out the control signals CS1 and CS2 again in a duration $T_2$ so as to turn on the switch SW1 and turn off the switch SW2. Since the voltage across both terminals of the load capacitor $C_L$ at the time is the voltage level of the sharing voltage $V_{EQ}$ of the storing/sharing capacitor $C_{EQ}$ already, the OPA 201 drives the load capacitor $C_L$ merely from the level of the sharing voltage $V_{EQ}$ up to the analog voltage $V_{DAC}$ in the high voltage level. After that, the digital system of the above-mentioned application device would once again send out the control signals CS1 and CS2 in a duration $T_3$ so as to turn off the switch SW1 and turn on the switch SW2, and in this way, the electric charges in the load capacitor $C_L$ to be released are stored in the storing/sharing capacitor $C_{EQ}$.

Then in the duration $T_{P2}$, the digital system of the above-mentioned application device is informed of that the status of the digital code DS received by the DAC 103 in the entire duration $T_{P2}$ is the analog voltage $V_{DAC}$ in the low voltage level; thus, the storing/sharing capacitor $C_{EQ}$ in a duration $T_4$ need not distribute electric charges to the load capacitor $C_L$. In the duration $T_4$, the digital system of the above-mentioned application device sends out the control signals CS1 and CS2 to turn off the switches SW1 and SW2.

After that, the digital system of the above-mentioned application device would send out the control signals CS1 and CS2 in a duration $T_5$ to turn on the switch SW1 and turn off the switch SW2, so that the OPA 201 pulls the level of the output voltage $V_{OUT}$ to the analog voltage $V_{DAC}$ in the low voltage level. Finally in a duration $T_6$, the load capacitor $C_L$ need not release electric charges to the storing/sharing capacitor $C_{EQ}$, so that the digital system of the above-mentioned application device sends out the control signals CS1 and CS2 again to turn off the switches SW1 and SW2 in the duration $T_6$.

Further in the duration $T_{P3}$, the digital system of the above-mentioned application device is informed of the status of the digital code DS received by the DAC 103 in the entire duration $T_{P3}$ is the analog voltage $V_{DAC}$ in the high voltage level. Thus, the digital system of the above-mentioned application device would send out the control signals CS1 and CS2 to turn off the switch SW1 and turn on the switch SW2 in a duration $T_7$. At this time, the electric charges in the storing/sharing capacitor $C_{EQ}$ stored prior the duration $T_3$ would be distributed to the load capacitor $C_L$. It can be seen before an OPA 201 is used to drive the load capacitor $C_L$, the voltage across both terminals of the load capacitor $C_L$ already has the voltage level of the sharing voltage $V_{EQ}$ of the storing/sharing capacitor $C_{EQ}$.

Furthermore, the digital system of the above-mentioned application device sends out the control signals CS1 and CS2 again to turn on the switch SW1 and turn off the switch SW2 in a duration T8. Since the voltage across both terminals of the load capacitor $C_L$ at this time is the voltage level of the sharing voltage $V_{EQ}$ of the storing/sharing capacitor $C_{EQ}$, the OPA 201 drives the load capacitor $C_L$ merely from the level of the sharing voltage $V_{EQ}$ UP to the analog voltage $V_{DAC}$ in the high voltage level. In the end, the digital system of the above-mentioned application device would once again send out the control signals CS1 and CS2 in a duration $T_9$ so as to turn off the switch SW1 and turn on the switch SW2, and in this way, the electric charges in the load capacitor $C_L$ to be released are stored in the storing/sharing capacitor $C_{EQ}$ in advance. By cyclically performing the above-described operation flowchart, the power-saving goal of the above-mentioned application device is achieved.

However, the above-described mechanism using the digital system of the above-mentioned application device is defective in deciding when the electric charges of the storing/sharing capacitor $C_{EQ}$ need to be shared with the load capacitor $C_L$ and deciding when the electric charges in the load capacitor $C_L$ to be released need to be stored in the storing/sharing capacitor $C_{EQ}$.

For example, first, assuming in the above-mentioned duration $T_{P2}$, the status of the digital code DS received by the DAC 103 is the analog voltage $V_{DAC}$ in the high voltage level, thus, the digital system of the above-mentioned application device is informed of the status of the digital code DS received by the DAC 103 in the entire duration $T_{P2}$ is the analog voltage $V_{DAC}$ in the high voltage level. In the duration $T_4$, the electric charges in a storing/sharing capacitor $C_{EQ}$ stored prior to the duration $T_3$ would be distributed to the load capacitor $C_L$. Thus, the digital system of the above-mentioned application device would send out the control signals CS1 and CS2 to turn off the switch SW1 and turn on the switch SW2.

Further in the durations $T_2$-$T_4$, the output voltage $V_{OUT}$ must fall from the high voltage level to the level of the sharing voltage $V_{EQ}$ first, followed by rising to the high voltage level in the duration $T_5$, but such a course still causes power consumption of the above-mentioned application device. In addition, in the duration when the electric charges stored in the storing/sharing capacitor $C_{EQ}$ must be distributed to the load capacitor $C_L$ and the electric charges stored in the storing/sharing capacitor $C_{EQ}$ is less than the electric charges stored in the load capacitor $C_L$, although the electric charges stored in the storing/sharing capacitor $C_{EQ}$ are supposedly to be distributed to the load capacitor $C_L$, but the real course is the opposite to the above mentioned that the load capacitor $C_L$ would share the electric charges stored therein with the storing/sharing capacitor $C_{EQ}$, which causes more power consumption of the above-mentioned application device.

SUMMARY OF THE INVENTION

Accordingly, the present invention is directed to an analog power-saving apparatus and a method thereof for sharing electric charges, wherein a novel analog judgment mechanism is used to overcome the negative effect caused by the conventional power-saving apparatus for sharing electric charges which uses the judgment mechanism of the digital system of the application device thereof.

The present invention provides an analog power-saving apparatus for sharing electric charges, which includes a DAC, an OPA, a load capacitor, an energy-storing unit and a control module, wherein the DAC produces an analog voltage according to a digital signal, the first input terminal of the OPA is for receiving the analog voltage produced by the DAC and the second input terminal is coupled to the output terminal thereof, the first terminal of the load capacitor is coupled to the output terminal of the OPA for outputting an output voltage and the second terminal of the load capacitor is coupled to a reference level.

The first terminal of the energy-storing unit is for outputting a sharing voltage and the second terminal of the energy-storing unit is coupled to the reference level. The control module is coupled to the output terminal of the OPA and the first terminal of the load capacitor for receiving a comparison signal produced at the output terminal of the OPA and thereby controlling the status of sharing electric charges between the load capacitor and the energy-storing unit, wherein the control module controls the status of sharing electric charges between the load capacitor and the energy-storing unit in analog operation mode.

In an embodiment of the present invention, the analog power-saving apparatus for sharing electric charges provided by the present invention further includes a first switch and a second switch, wherein the first terminal of the first switch is coupled to the second input terminal of the OPA and the second terminal of the first switch is coupled to the first terminal of the load capacitor. The first terminal of the second switch is coupled to the second input terminal of the OPA and the second terminal of the second switch is coupled to the output terminal of the OPA.

In an embodiment of the present invention, the control module is for enabling the output terminal of the OPA to produce a comparison signal in a high voltage level in a first duration when the above-mentioned analog voltage is higher than the output voltage and the electric charges stored in the energy-storing unit are greater than the electric charges stored in the load capacitor, so that the electric charges stored in the energy-storing unit are distributed to the load capacitor and in a second duration the level of the output voltage is boosted to the level of the analog voltage.

In addition, in a third duration, when the above-mentioned analog voltage is lower than the output voltage and the electric charges stored in the load capacitor are greater than the electric charges stored in the energy-storing unit, the output terminal of the OPA produces a comparison signal in a low voltage level, so that the electric charges to be released in the load capacitor are stored in the energy-storing unit, but the electric charges stored in the load capacitor after discharge are required not less than the electric charges stored in the energy-storing unit after storage. Further in a fourth duration, the level of the output voltage is reduced to the level of the analog voltage.

In an embodiment of the present invention, the above-mentioned first switch is on in the first duration and the third duration, and the second switch is on in the second duration and the fourth duration.

In an embodiment of the present invention, the above-mentioned control unit includes a control signal generating unit, a control voltage generating unit and a switch unit, wherein the control signal generating unit generates a first control signal and a second control signal according to the above-mentioned comparison signal in the high voltage level or comparison signal in the low voltage level. The control voltage generating unit is for respectively receiving the above-mentioned output voltage and sharing voltage and generates a control voltage according to the first control signal and the second control signal.

The first terminal of the switch unit is coupled to the output terminal of the OPA, the second terminal of the switch unit is employed for receiving the above-mentioned sharing voltage, the third terminal of the switch unit is employed for receiving the control voltage generated by the control voltage generating unit and the output terminal of the switch unit is employed for producing the above-mentioned output voltage. In the first duration, when the above-mentioned analog voltage is higher than the output voltage and the electric charges stored in the energy-storing unit are greater than the electric charges stored in the load capacitor, the electric charges stored in the energy-storing unit are distributed to the load capacitor and in a second duration the level of the output voltage is boosted to the level of the analog voltage.

In addition, in the third duration, when the above-mentioned analog voltage is lower than the output voltage and the electric charges stored in the load capacitor are greater than the electric charges stored in the energy-storing unit, the output terminal of the OPA produces the comparison signal in the low voltage level, so that the electric charges to be released in the load capacitor are stored in the energy-storing unit, but the electric charges stored in the load capacitor after discharge are required not less than the electric charges stored in the energy-storing unit after storage. Further in the fourth duration, the level of the output voltage is reduced to the level of the analog voltage.

In an embodiment of the present invention, the control signal generating unit includes a third switch, a fourth switch, a first inverter and a second inverter, wherein the first terminal of the third switch is employed for receiving the comparison signal in the high voltage level or the comparison signal in the low voltage level, the first terminal of the fourth switch is coupled to a system voltage and the second terminal of the fourth switch is coupled to the second terminal of the third switch. The inverting input terminal of the first inverter is coupled to the second terminal of the fourth switch and the output terminal of the first inverter produces the above-mentioned second control signal. The inverting input terminal of the second inverter is coupled to the output terminal of the first inverter and the output terminal of the second inverter produces the above-mentioned first control signal. Note that the third switch is in the on state in the first duration and the third duration, and the fourth switch is in the on state in the second duration and the fourth duration.

In an embodiment of the present invention, the above-mentioned control voltage generating unit includes a fifth switch, a sixth switch, an NMOS transistor, a constant-current source, a seventh switch and an eighth switch, wherein the first terminals of the fifth switch and the sixth switch are respectively coupled to the first terminal of the load capacitor and the first terminal of the energy-storing unit, the second terminals of the fifth switch and the sixth switch are coupled to the gate of the NMOS transistor, the drain of the NMOS transistor is coupled to the above-mentioned system voltage and the constant-current source is coupled between the source of the NMOS transistor and the above-mentioned reference level.

The first terminal of the seventh switch is coupled to the source of the NMOS transistor, the first terminal of the eighth switch is coupled to the above-mentioned system voltage, and the second terminal of the eighth switch is coupled to the second terminal of the seventh switch and for producing the above-mentioned control voltage. The on/off states of the above-mentioned fifth switch and sixth switch herein are decided by the above-mentioned first control signal and second control signal, the seventh switch is in the on state in the first duration and the third duration and the eighth switch is in on state in the second duration and the fourth duration.

In an embodiment of the present invention, when the above-mentioned first control signal and second control signal take the high voltage level, the fifth switch and the sixth switch are in on state; otherwise, they are in off state.

In an embodiment of the present invention, the switch unit includes a ninth switch and a PMOS transistor, wherein the first terminal of the ninth switch is coupled to the output terminal of the OPA and the second terminal of the ninth switch is coupled to the first terminal of the load capacitor. The gate of the PMOS is employed for receiving the above-mentioned control voltage, the first drain/source of the PMOS transistor is coupled to the first terminal of the energy-storing unit and the second drain/source of the PMOS transistor is coupled to the first terminal of the load capacitor. The ninth switch herein is in the on state in the second duration and the fourth duration, and the on/off states of the PMOS transistor is decided by the above-mentioned control voltage, output voltage and sharing voltage.

On the other hand, the present invention provides an analog power-saving method for sharing electric charges, which is suitable for the above-mentioned analog power-saving apparatus for sharing electric charges provided by the present invention. The analog power-saving method for sharing electric charges includes following steps. First, in the first duration, when the above-mentioned analog voltage is higher than the output voltage and the electric charges stored in the energy-storing unit are greater than the electric charges stored in the load capacitor, the output terminal of the OPA produces the comparison signal in the high voltage level, so that the electric charges stored in the energy-storing unit are distributed to the load capacitor and in a second duration the level of the output voltage is boosted to the level of the analog voltage.

After that, in the third duration, when the above-mentioned analog voltage is lower than the output voltage and the electric charges stored in the load capacitor are greater than the electric charges stored in the energy-storing unit, the output terminal of the OPA produces the comparison signal in the low voltage level, so that the electric charges to be released in the load capacitor are stored in the energy-storing unit, but the electric charges stored in the load capacitor after discharge are required not less than the electric charges stored in the energy-storing unit after storage. Further in the fourth duration, the level of the output voltage is reduced to the level of the analog voltage.

In an embodiment of the present invention, the method further includes the following steps in the first duration. First, the first switch, the third switch and the seventh switch are turned on, so that the OPA functions as a comparator to compare the above-mentioned analog voltage with the output voltage to thereby enable the output terminal of the OPA to obtain a comparison signal in the high voltage level. Then, the above-mentioned first control signal takes the high voltage level and the above-mentioned second control signal takes the low voltage level so as to turn on the fifth switch and turn off the sixth switch according the comparison signal in the high voltage level. After that, the source of the NMOS transistor produces the above-mentioned control voltage according to the above-mentioned output voltage received by the gate of the NMOS. Further, the PMOS transistor is turned on according the control voltage received by the gate thereof so as to distribute the electric charges stored in the energy-storing unit to the load capacitor.

In an embodiment of the present invention, the method further includes the following steps in the second duration: turning off the first, third and seventh switches and turning on the second, fourth, eighth and ninth switches so as to make the OPA function as a unit gain amplifier; and turning off the PMOS transistor so as to use the unit gain amplifier to boost the level of the above-mentioned output voltage to the level of the analog voltage.

In an embodiment of the present invention, the method further includes the following steps in the third duration. First, the first switch, the third switch and the seventh switch are turned on and the second switch, the fourth switch, the eighth switch and the ninth switch are turned off, so that the OPA functions as a comparator to compare the above-mentioned analog voltage with the output voltage to thereby enable the output terminal of the OPA to obtain a comparison signal in the low voltage level. Next, the above-mentioned first control signal takes the low voltage level and the above-mentioned second control signal takes the high voltage level so as to turn off the fifth switch and turn on the sixth switch according to the comparison signal in the low voltage level.

Then, the source of the NMOS transistor produces the above-mentioned control voltage according to the sharing voltage received by the gate of the NMOS transistor. After that, the PMOS is turned on according to the control voltage received by the gate of the PMOS so as to store the electric charges to be released in the load capacitor into the energy-storing unit, but the electric charges stored in the load capacitor after discharge are required not less than the electric charges stored in the energy-storing unit after storage; otherwise, the PMOS transistor is turned off.

In an embodiment of the present invention, the method further includes the following steps in the third duration. During the load capacitor releasing electric charges to the energy-storing unit, when the above-mentioned analog voltage is greater than the output voltage, the comparison signal at the output terminal of the OPA is changed from the low voltage level to the high voltage level and the PMOS transistor is turned off.

In an embodiment of the present invention, the method further includes the following steps in the fourth duration: turning off the first, third and seventh switches and turning on the second, fourth, eighth and ninth switches so as to make the OPA function as a unit gain amplifier; and turning off the PMOS transistor so as to use the unit gain amplifier to reduce the level of the output voltage to the level of the analog voltage.

The key part of the present invention is the analog power-saving apparatus and the method thereof for sharing electric charges provided by the present invention uses an analog judgment mechanism, so that in a duration the energy-storing unit must distribute the stored electric charges thereof to the load capacitor and when the electric charges stored in the energy-storing unit are less than the electric charges stored in the load capacitor, the path for the energy-storing unit to distribute electric charges to the load capacitor is blocked; after the load capacitor releases electric charges to the energy-storing unit for storage, the electric charges still stored in the load capacitor after discharge are controlled to be not less than the electric charges stored in the energy-storing unit after storage.

In this way, the analog power-saving apparatus and the method thereof for sharing electric charges provided by the present invention can overcome the negative effect caused by the conventional power-saving apparatus for sharing electric charges which uses the judgment mechanism of the digital system of the application device thereof. Therefore, an application device employs the analog power-saving apparatus and the method thereof for sharing electric charges provided by the present invention can effectively achieve power-saving goal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
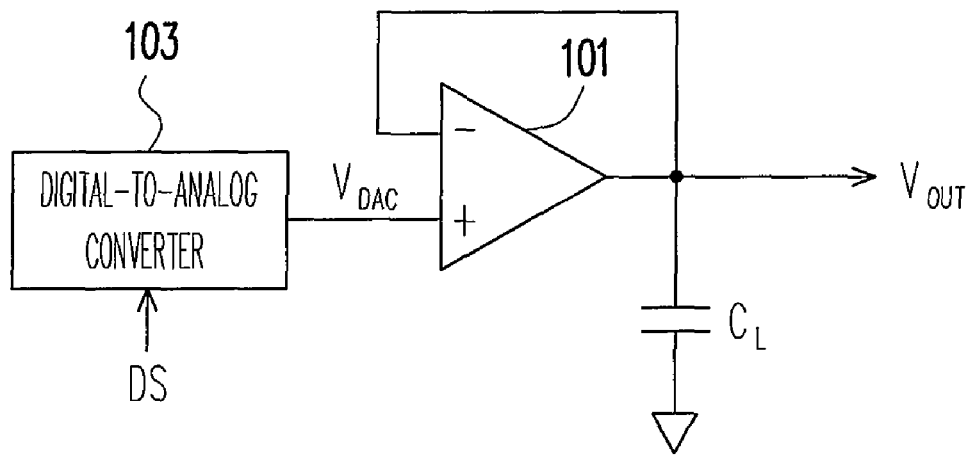
FIG. 1 is a conventional circuit diagram showing an OPA is used to drive a load capacitor.
Figure 2:
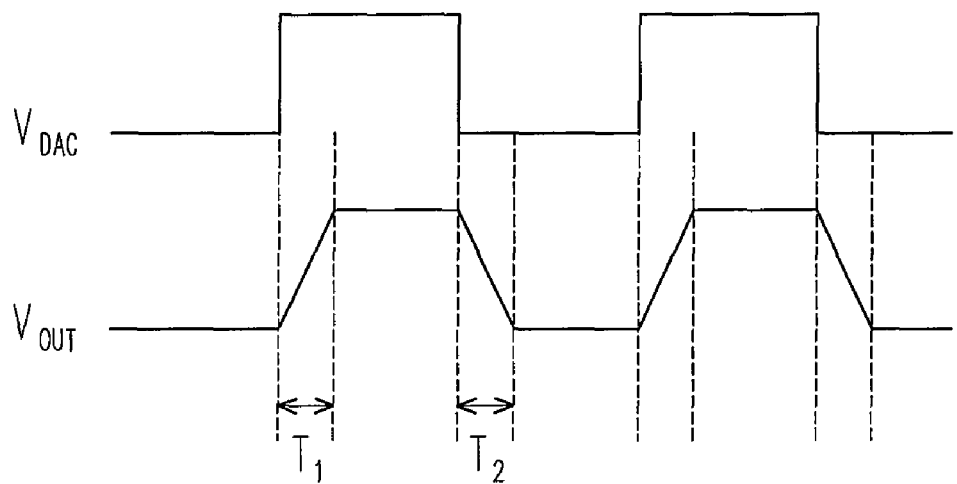
FIG. 2 is a signal waveform diagram of the analog voltage and the output voltage in FIG. 1.
Figure 3:
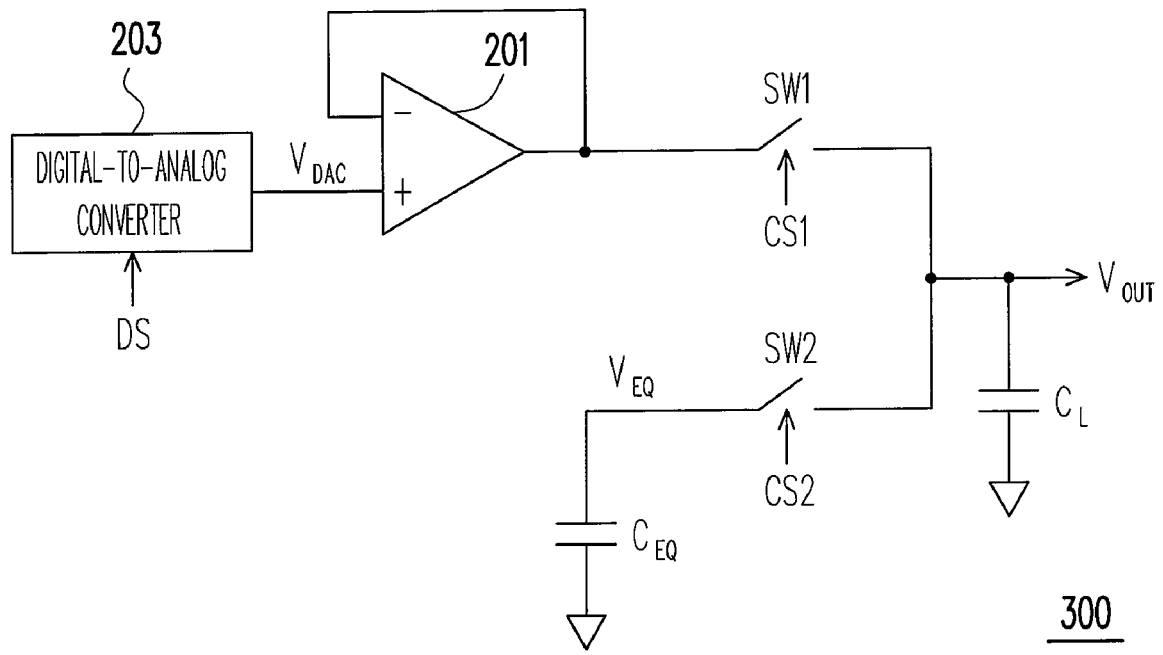
FIG. 3 is a circuit diagram of a conventional power-saving apparatus commonly used for sharing electric charges.
Figure 4:
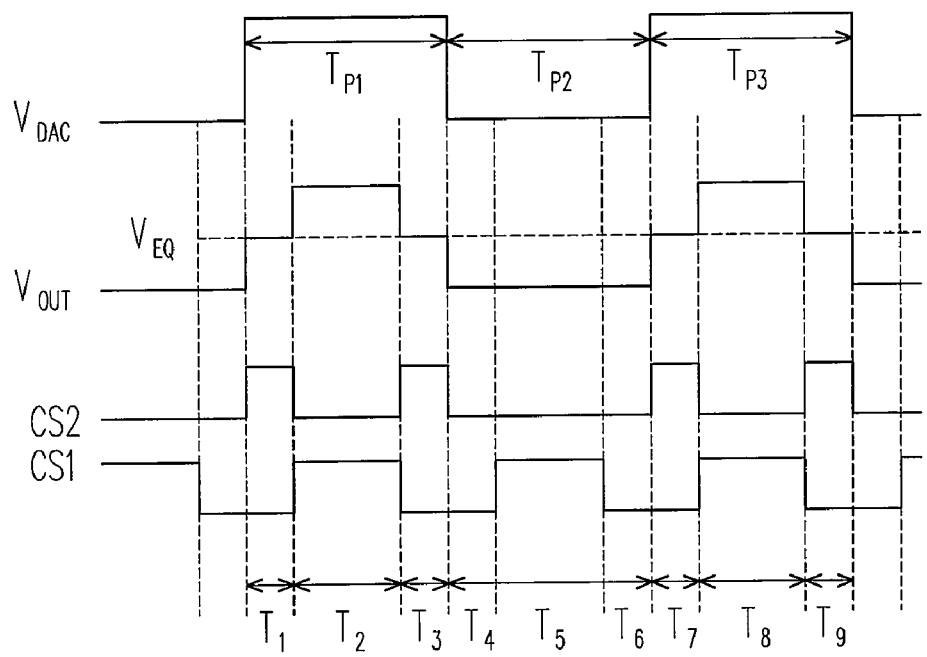
FIG. 4 is a signal waveform diagram of the analog voltage and the output voltage of the power-saving apparatus for sharing electric charges in FIG. 3 including the control signals of two switches thereof.

Reference will now be made in detail to the present preferred embodiments of the invention, examples of which are illustrated in the accompanying drawings. Wherever possible, the same reference numbers are used in the drawings and the description to refer to the same or like parts.

The technical objective of the present invention is to solve the problem of the negative effect caused by the conventional power-saving apparatus for sharing electric charges which uses the judgment mechanism of the digital system of the application device thereof. In the following, the features and the functions of the present invention are clearly depicted so as to provide anyone skilled in the art for reference.

Figure 5:
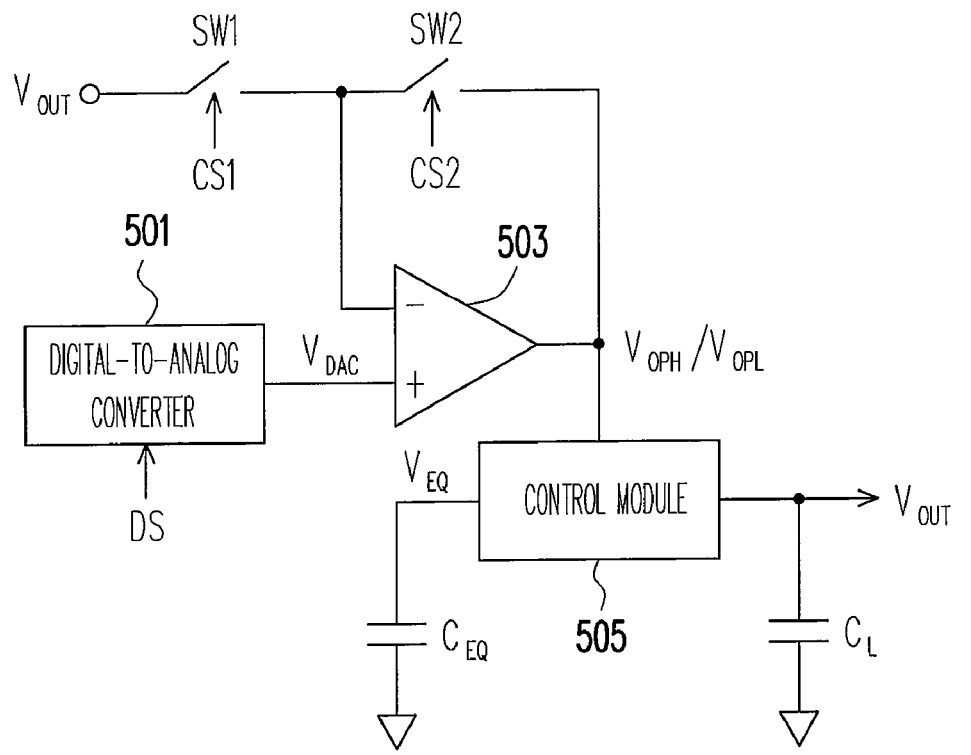
FIG. 5 is a block diagram of an analog power-saving apparatus for sharing electric charges according to an embodiment of the present invention.

FIG. 5 is a block diagram of an analog power-saving apparatus 500 for sharing electric charges according to an embodiment of the present invention. Referring to FIG. 5, the analog power-saving apparatus for sharing electric charges 500 includes a DAC 501, an OPA 503, a first switch SW1 and a second switch SW2, a load capacitor $C_L$, a energy-storing unit (for example, a storing/sharing capacitor $C_{EQ}$) and a control module 505, wherein the DAC 501 produces an analog voltage $V_{DAC}$ according to a digital signal DS provided by a digital system of the application device (not shown) in which the power-saving apparatus 500 is applied.

The positive input terminal (+) of the OPA 503 is for receiving an analog voltage $V_{DAC}$ produced by the DAC 501, the negative input terminal of the OPA 503 is coupled to the first terminals of the first and second switches SW1 and SW2 and the output terminal of the OPA 503 is coupled to the second terminal of the second switch. The first terminal of the load capacitor $C_L$ is coupled to the second terminal of the first switch SW2 for outputting an output voltage $V_{OUT}$ and the second terminal of the load capacitor $C_L$ is coupled to a reference level (for example, ground level). The first terminal of the storing/sharing capacitor $C_{EQ}$ is for outputting a sharing voltage $V_{EQ}$ and the second terminal of the storing/sharing capacitor $C_{EQ}$ is coupled to the above-mentioned reference level.

The control module 505 is coupled to the output terminal of the OPA 503 and the first terminals of the storing/sharing capacitor $C_{EQ}$ and the load capacitor $C_L$. In a first duration, when the analog voltage $V_{DAC}$ is higher than the output voltage $V_{OUT}$ and the electric charges stored in the storing/sharing capacitor $C_{EQ}$ are greater than the electric charges stored in the load capacitor $C_L$, the output terminal of the OPA 503 produces a comparison signal $V_{OPH}$ in a high voltage level, so that the electric charges to be released in the storing/sharing capacitor $C_{EQ}$ are distributed to the load capacitor $C_L$, and in a second duration, the level of the output voltage $V_{OUT}$ is boosted to the level of the analog voltage $V_{DAC}$.

In a third duration, when the analog voltage $V_{DAC}$ is lower than the output voltage $V_{OUT}$ and the electric charges stored in the load capacitor $C_L$ are greater than the electric charges stored in the storing/sharing capacitor $C_{EQ}$, the control module 505 makes the output terminal of the OPA 503 produces a comparison signal $V_{OPL}$ in the low voltage level, so that the electric charges to be released in the load capacitor $C_L$ are stored in the storing/sharing capacitor $C_{EQ}$, but the electric charges stored in the load capacitor $C_L$ after discharge are required not less than the electric charges stored in the storing/sharing capacitor $C_{EQ}$ after storage. In a fourth duration, the control module 505 reduces the level of the output voltage $V_{OUT}$ to the level of the analog voltage $V_{DAC}$. In the embodiment, the first switch SW1 is in the on state in the first and third durations and the second switch SW2 is in the on state in the second and fourth durations.

Figure 6:
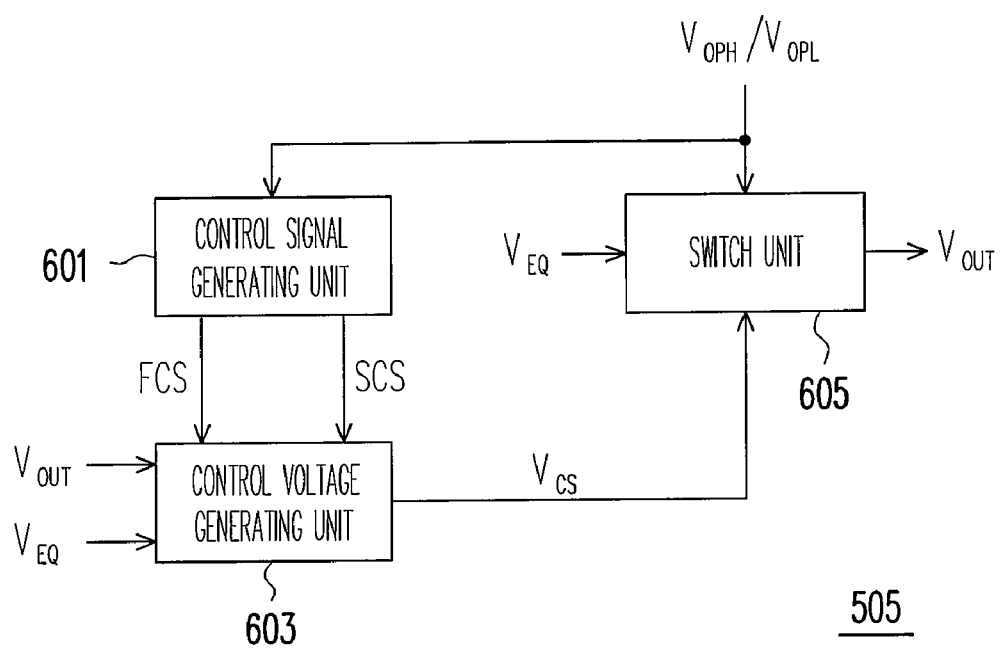
FIG. 6 is a configuration block diagram of the control module of the present invention.

FIG. 6 is a configuration block diagram of the control module 505 of the present invention. Referring to FIGS. 5 and 6, the control module 505 includes a control signal generating unit 601, a control voltage generating unit 603 and a switch unit 605, wherein the control signal generating unit 601 generates a first control signal FCS and a second control signal SCS according to the comparison signal $V_{OPH}$ in the high voltage level or the comparison signal $V_{OPL}$ in the low voltage level produced by the output terminal of the OPA 503. The control voltage generating unit 603 is employed for receiving the output voltage $V_{OUT}$ and the sharing voltage $V_{EQ}$, and generates a control voltage $V_{CS}$ according to the first and second control signals FCS and SCS generates by the control signal generating unit 601.

The first terminal of the switch unit 605 is coupled to the output terminal of the OPA 503, the second terminal of the switch unit 605 is employed for receiving the sharing voltage $V_{EQ}$, the third terminal of the switch unit 605 is employed for receiving the control voltage $V_{CS}$ generated by the control voltage generating unit 603 and the output terminal of the switch unit 605 is employed for generating the output voltage $V_{OUT}$. In the first duration, when the analog voltage $V_{DAC}$ is higher than the output voltage $V_{OUT}$ and the electric charges stored in the storing/sharing capacitor $C_{EQ}$ are greater than the electric charges stored in the load capacitor $C_L$, the switch unit 605 distributes the electric charges stored in the storing/sharing capacitor $C_{EQ}$ to the load capacitor $C_L$, and in the second duration, the switch unit 605 boosts the level of the output voltage $V_{OUT}$ to the level of the analog voltage $V_{DAC}$.

In the third duration, when the analog voltage $V_{DAC}$ is lower than the output voltage $V_{OUT}$ and the electric charges stored in the load capacitor $C_L$ are greater than the electric charges stored in the storing/sharing capacitor $C_{EQ}$, the switch unit 605 makes the electric charges to be released in the load capacitor $C_L$ stored in the storing/sharing capacitor $C_{EQ}$, but the electric charges stored in the load capacitor $C_L$ after discharge are required not less than the electric charges stored in the storing/sharing capacitor $C_{EQ}$ after storage. In the fourth duration, the switch unit 605 reduces the level of the output voltage $V_{OUT}$ to the level of the analog voltage $V_{DAC}$.

Figure 7:
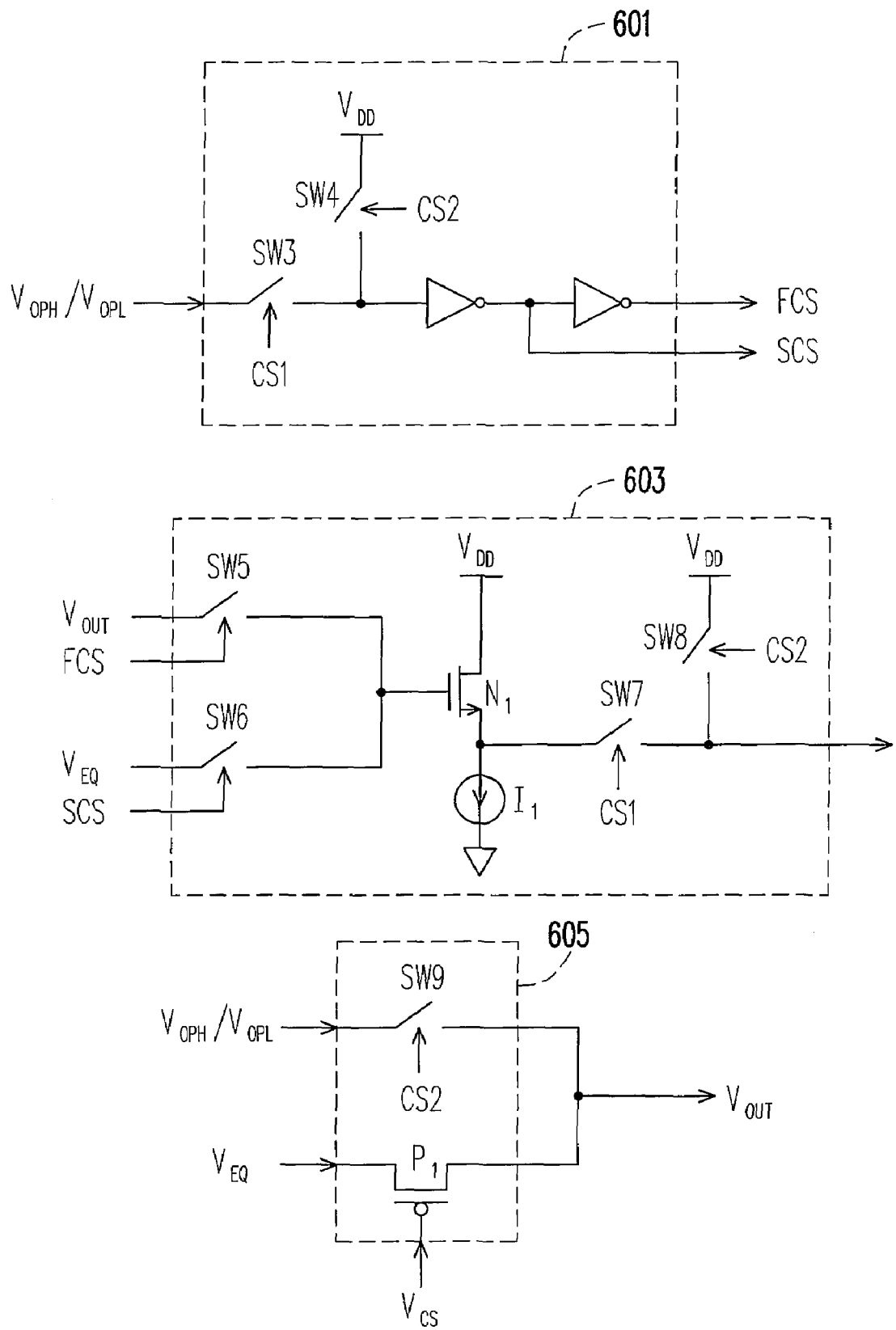
FIG. 7 shows the sub-circuits comprising a control module of the present invention.

FIG. 7 shows the sub-circuits comprising a control module 505 of the present invention. Referring to FIGS. 5-7, the control signal generating unit 601 of the present invention includes a third switch SW3, a fourth switch SW4, a first inverter INV1 and a second inverter INV2, wherein the first terminal of the third switch SW3 is employed for receiving the comparison signal $V_{OPH}$ in the high voltage level or the comparison signal $V_{OPL}$ in the low voltage level produced by the OPA 503. The first terminal of the fourth switch SW4 is coupled to a system voltage $V_{DD}$ and the second terminal of the fourth switch SW4 is coupled to the second terminal of the third switch SW3.

The inverting input terminal of the first inverter INV1 is coupled to the second terminal of the fourth switch SW4 and the output terminal of the first inverter INV1 produces the second control signal SCS. The inverting input terminal of the second inverter INV2 is coupled to the output terminal of the first inverter INV1 and the output terminal of the second inverter INV2 produces the first control signal FCS. In the embodiment, the third switch SW3 is in the on state in the first duration and the third duration, and the fourth switch SW4 is in the on state in the second duration and the fourth duration.

The control voltage generating unit 603 of the present invention includes a fifth switch SW5, a sixth switch SW6, an NMOS transistor $N_1$, a constant-current source $I_1$, a seventh switch SW7 and an eighth switch SW8, wherein the first terminals of the fifth switch SW5 and the sixth switch SW6 are respectively coupled to the first terminal of the load capacitor $C_L$ and the first terminal of the storing/sharing capacitor $C_{EQ}$, the second terminals of the fifth switch SW5 and the sixth switch SW6 are coupled to the gate of the NMOS transistor $N_1$, the drain of the NMOS transistor $N_1$, is coupled to the above-mentioned system voltage $V_{DD}$ and the constant-current source $I_1$ is coupled between the source of the NMOS transistor $N_1$ and the above-mentioned reference level. The first terminal of the seventh switch SW7 is coupled to the source of the NMOS transistor $N_1$, the first terminal of the eighth switch SW8 is coupled to the above-mentioned system voltage $V_{DD}$ and the second terminal of the eighth switch SW8 is coupled to the second terminal of the seventh switch SW7 and for producing the above-mentioned control voltage $V_{CS}$.

In the embodiment, the on/off states of the fifth switch SW5 and sixth switch SW6 are decided by the first control signal FCS and second control signal SCS generated by the control signal generating unit 601, wherein when the first control signal FCS and second control signal SCS take the high voltage level, the fifth switch SW5 and sixth switch SW6 are turned on; otherwise, they are turned off. In addition, the seventh switch SW7 is in the on state in the first duration and the third duration and the eighth switch SW8 is in the on state in the second duration and the fourth duration.

In an embodiment, the switch unit 605 includes a ninth switch SW9 and a PMOS transistor $P_1$, wherein the first terminal of the ninth switch SW9 is coupled to the output terminal of the OPA 503 and the second terminal of the ninth switch SW9 is coupled to the first terminal of the load capacitor $C_L$. The gate of the PMOS transistor $P_1$ is for receiving the control voltage $V_{CS}$ generated by the control voltage generating unit 603, the first drain/source of the PMOS transistor $P_1$ is coupled to the first terminal of the storing/sharing capacitor $C_{EQ}$ and the second drain/source of the PMOS transistor $P_1$ is coupled to the first terminal of the load capacitor $C_L$. The ninth switch SW9 in the embodiment is in the on state in the second duration and the fourth duration, and the on/off states of the PMOS transistor $P_1$ is decided by the relationship between the above-mentioned control voltage $V_{CS}$, output voltage $V_{OUT}$ and sharing voltage $V_{EQ}$.

In order to more clearly explain the operation flowchart of the above-mentioned analog power-saving apparatus for sharing electric charges and the technical goal to be achieved, an analog power-saving method for sharing electric charges is provided for anyone skilled in the art to more clearly understand the spirit of the present invention.

Figure 8:
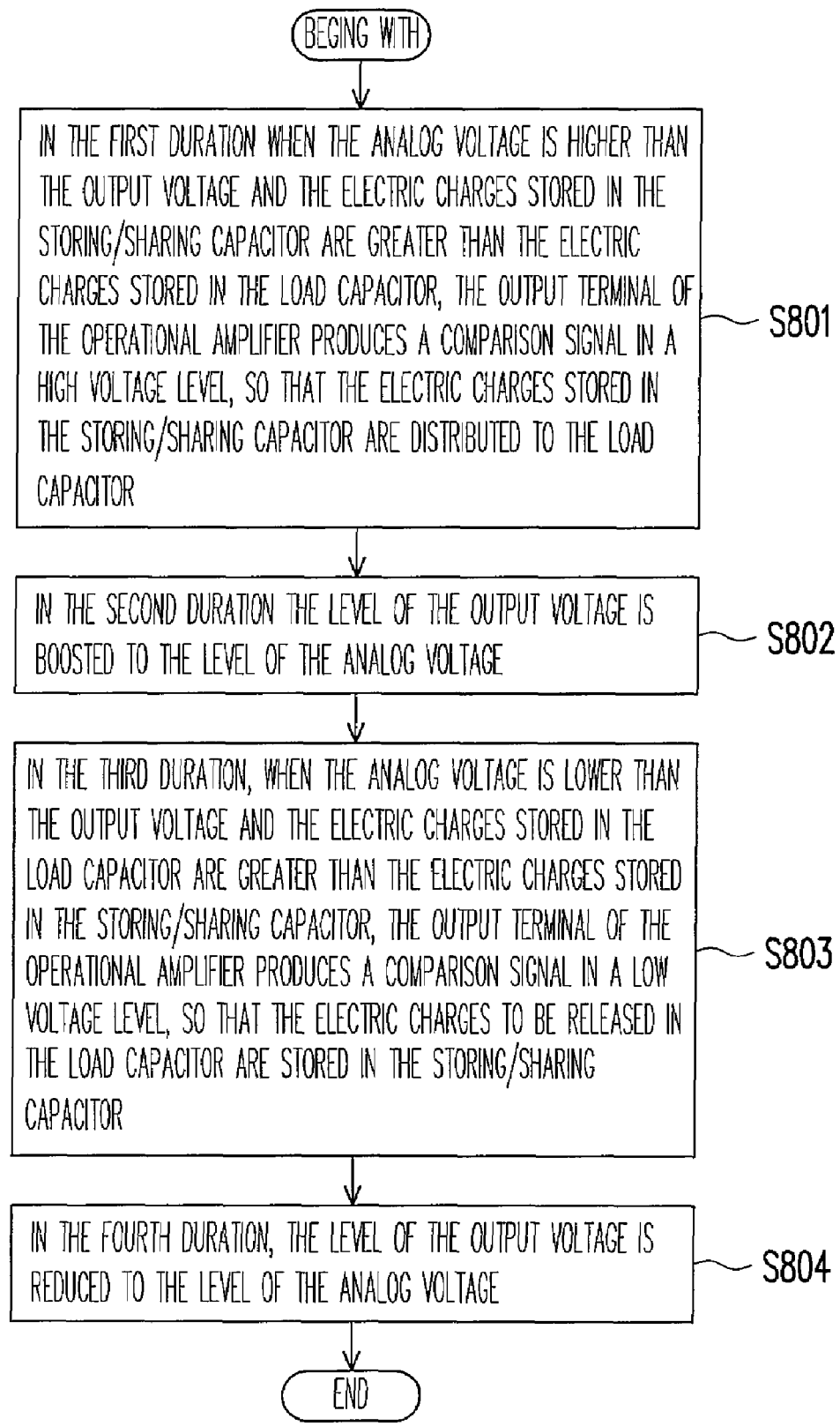
FIG. 8 is a flowchart of an analog power-saving method for sharing electric charges according to an embodiment of the present invention.
Figure 9:
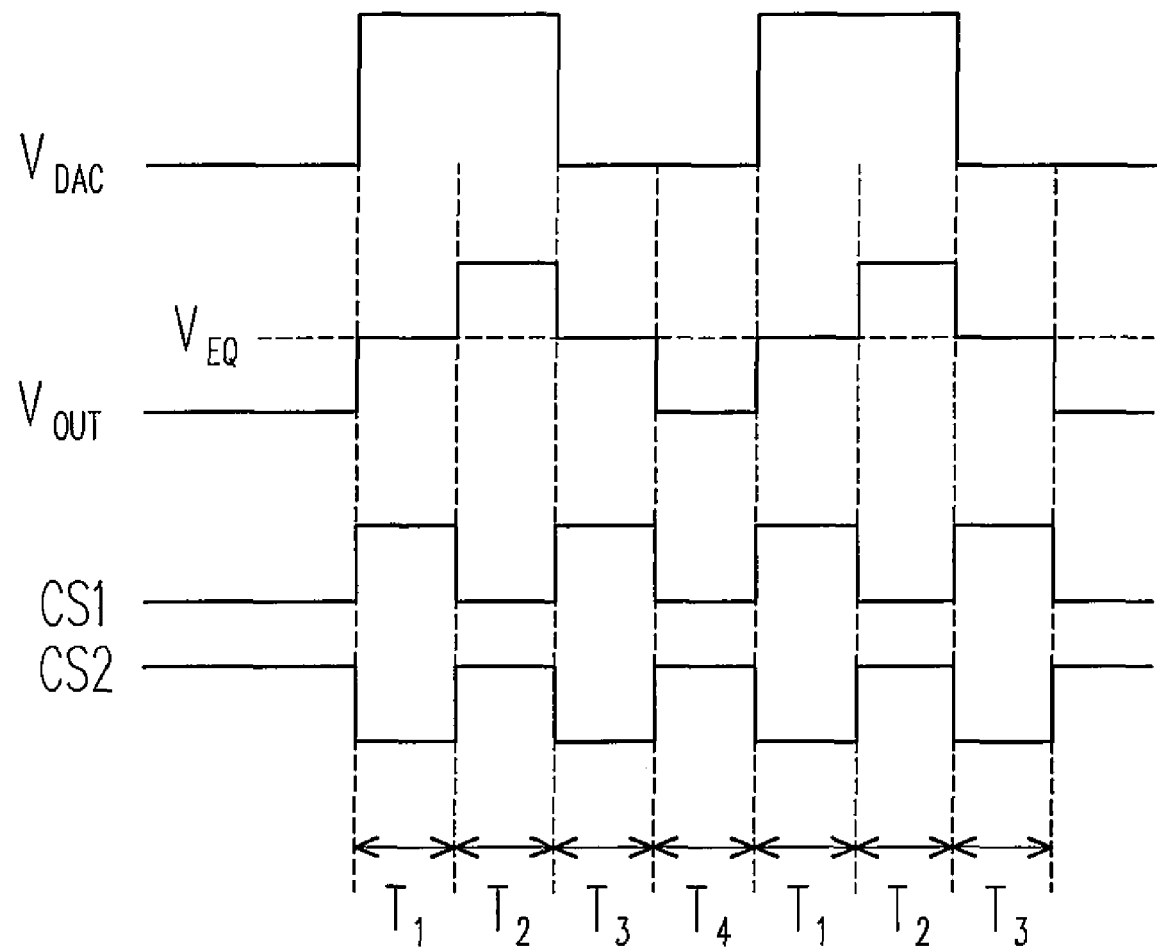
FIG. 9 is a signal waveform diagram of the output voltage, the analog voltage, the sharing voltage and the control signals of the switches in an analog power-saving apparatus for sharing electric charges provided by the present invention.

FIG. 8 is a flowchart of an analog power-saving method for sharing electric charges according to an embodiment of the present invention and FIG. 9 is a signal waveform diagram of the output voltage $V_{OUT}$, the analog voltage $V_{DAC}$, the sharing voltage $V_{EQ}$ and the control signals CS1 and CS2 of the switches SW1-SW4 and SW7-SW9 in an analog power-saving apparatus for sharing electric charges provided by the above-mentioned embodiment of the present invention. The analog power-saving method for sharing electric charges is suitable for the analog power-saving apparatus 500 for sharing electric charges provided by the above-mentioned embodiment.

The analog power-saving method for sharing electric charges provided by the embodiment includes the following steps. First, in step S801, in the first duration $T_1$, when the above-mentioned analog voltage $V_{DAC}$ is higher than the output voltage $V_{OUT}$ and the electric charges stored in the storing/sharing capacitor $C_{EQ}$ are greater than the electric charges stored in the load capacitor $C_L$, the output terminal of the OPA 503 generates a comparison signal $V_{OPH}$ in the high voltage level, so that the electric charges stored in the storing/sharing capacitor $C_{EQ}$ are distributed to the load capacitor $C_L$.

In more detail, in step S801, first, the first switch SW1, the third switch SW3 and the seventh switch SW7 are turned on and the second switch SW2, the fourth switch SW4, the eighth switch SW8 and the ninth switch SW9 are turned off, so that the OPA 503 functions as a comparator to compare the analog voltage $V_{DAC}$ with the output voltage $V_{OUT}$. Since in the first duration $T_1$ the analog voltage $V_{DAC}$ is greater than the output voltage $V_{OUT}$ which can be known from the above-mentioned comparison result, thus, the output terminal of the OPA 503 would take the comparison signal $V_{OPH}$ in the high voltage level.

Next, since in the first duration $T_1$, the output terminal of the OPA 503 takes the comparison signal $V_{OPH}$ in the high voltage level, thus, the control signal generating unit 601 generates the first control signal FCS in the high voltage level and the second control signal SCS in the low voltage level according to the comparison signal $V_{OPH}$ in the high voltage level and thereby the fifth switch SW5 is turned on and the sixth switch SW6 is turned off in the control voltage generating unit 603.

Next, the gate of the NMOS transistor $N_1$ in the control voltage generating unit 603 receives the output voltage $V_{OUT}$ and the source thereof produces a control voltage $V_{CS}$, wherein the amount of the control voltage $V_{CS}$ is the difference between the output voltage $V_{OUT}$ and the gate-source voltage Vgs1 of the NMOS transistor $N_1$, that is, $V_{CS}=V_{OUT}-$Vgs1.

Finally, the gate of the PMOS transistor $P_1$ in the switch unit 605 receives the control voltage $V_{CS}$ generated by the control voltage generating unit 603. At this time in the first duration $T_1$, since the analog voltage $V_{DAC}$ is higher than the output voltage $V_{OUT}$ and the electric charges stored in the storing/sharing capacitor $C_{EQ}$ are greater than the electric charges stored in the load capacitor $C_L$, the gate-source voltage Vgs2 of the PMOS transistor $P_1$ is the difference between the sharing voltage $V_{EQ}$ and the control voltage $V_{CS}$, that is, Vgs2=$V_{EQ}-(V_{OUT}-$Vgs1). Further, the Vgs2 is greater than zero, thus, in the first duration $T_1$, the PMOS transistor $P_1$ is turned on to distribute the electric charges stored in the storing/sharing capacitor $C_{EQ}$ to the load capacitor $C_L$.

As pointed out in step S802, in the second duration $T_2$, the level of the output voltage $V_{OUT}$ is boosted to the level of the analog voltage $V_{DAC}$. In more detail, in step S802, the first switch SW1, the third switch SW3 and the seventh switch SW7 are turned off and the second switch SW2, the fourth switch SW4, the eighth switch SW8 and the ninth switch SW9 are turned on, so that the OPA 503 functions as a unit gain amplifier.

Thereby, the system voltage $V_{DD}$ is provided to the gate of the PMOS transistor $P_1$ and thus the gate-source voltage Vgs2 of the PMOS transistor $P_1$ is less than zero to turn off the PMOS transistor $P_1$ in the second duration $T_2$. Meanwhile, since the load capacitor $C_L$ has the level of the sharing voltage $V_{EQ}$ due to storage in the first duration $T_1$, thus in the second duration $T_2$, the OPA 503 boosts the voltage level thereof merely from the level of the sharing voltage $V_{EQ}$ UP to the analog voltage $V_{DAC}$ in the high voltage level. In this way, the application device using the analog power-saving apparatus 500 for sharing electric charges provided by the present invention can achieve the power-saving goal.

Furthermore as described in step S803, in the third duration $T_3$, when the analog voltage $V_{DAC}$ is lower than the output voltage $V_{OUT}$ and the electric charges stored in the load capacitor $C_L$ are greater than the electric charges stored in the storing/sharing capacitor $C_{EQ}$, the output terminal of the OPA 503 produces a comparison signal $V_{OPL}$ in the low voltage level, so that the electric charges to be released in the load capacitor $C_L$ are stored in the storing/sharing capacitor $C_{EQ}$, but the electric charges stored in the load capacitor $C_L$ after discharge are required not less than the electric charges stored in the storing/sharing capacitor $C_{EQ}$ after storage.

In more detail, in step S803, first, the first switch SW1, the third switch SW3 and the seventh switch SW7 are turned on and the second switch SW2, the fourth switch SW4, the eighth switch SW8 and the ninth switch SW9 are turned off, so that the OPA 503 functions as a comparator to compare the analog voltage $V_{DAC}$ with the output voltage $V_{OUT}$. Since in the third duration $T_3$ the analog voltage $V_{DAC}$ is lower than the output voltage $V_{OUT}$, thus, the output terminal of the OPA 503 would take the comparison signal $V_{OPH}$ in the low voltage level.

Next, since in the first duration $T_3$, the output terminal of the OPA 503 takes the comparison signal $V_{OPL}$ in the low voltage level, thus, the control signal generating unit 601 generates the first control signal FCS in the low voltage level and the second control signal SCS in the high voltage level according to the comparison signal $V_{OPL}$ in the low voltage level and thereby the fifth switch SW5 is turned off and the sixth switch SW6 is turned on in the control voltage generating unit 603.

Next, the gate of the NMOS transistor $N_1$ in the control voltage generating unit 603 receives the sharing voltage $V_{EQ}$ and the source thereof produces a control voltage $V_{CS}$, wherein the amount of the control voltage $V_{CS}$ is the difference between the sharing voltage $V_{EQ}$ and the gate-source voltage Vgs1 of the NMOS transistor $N_1$, that is, $V_{CS}=V_{EQ}-$Vgs1.

Finally, the gate of the PMOS transistor $P_1$ in the switch unit 605 receives the control voltage $V_{CS}$ generated by the control voltage generating unit 603. At this time in the first duration $T_3$, since the analog voltage $V_{DAC}$ is lower than the output voltage $V_{OUT}$ and the electric charges stored in the load capacitor $C_L$ are greater than the electric charges stored in the storing/sharing capacitor $C_{EQ}$, the gate-source voltage Vgs2 of the PMOS transistor $P_1$ is the difference between the output voltage $V_{OUT}$ and the control voltage $V_{CS}$, that is, Vgs2=$V_{OUT}-(V_{EQ}-$Vgs1) and the Vgs2 is greater than zero. Thus, in the third duration $T_3$, the PMOS transistor $P_1$ is turned on to make the electric charges stored in the load capacitor $C_L$ store in the storing/sharing capacitor $C_{EQ}$.

However, in the course when the load capacitor $C_L$ discharges and makes the electric charges thereof store in the storing/sharing capacitor $C_{EQ}$, once the analog voltage $V_{DAC}$ is higher than the output voltage $V_{OUT}$, the output terminal of the OPA 503 transits the voltage level thereof from the comparison signal $V_{OPL}$ in the low voltage level to the comparison signal $V_{OPH}$ in the high voltage level. Therefore, the control voltage $V_{CS}$ received by the gate of the PMOS transistor $P_1$ would be the difference between the output voltage $V_{OUT}$ and the gate-source voltage Vgs1 of the NMOS transistor $N_1$, that is, $V_{CS}=V_{OUT}-$Vgs1. Further, considering the output voltage $V_{OUT}$ at this time must be greater than the sharing voltage $V_{EQ}$, the PMOS transistor $P_1$ must be turned off. Consequently, the amount of electric charges stored in the load capacitor $C_L$ after discharge would not be less than the amount of electric charges stored in the storing/sharing capacitor $C_{EQ}$ after storage. Moreover, considering the OPA 503 at the time is in open-loop state, the output voltage $V_{OUT}$ would be near to the analog voltage $V_{DAC}$.

As pointed out in step S804, in the fourth duration $T_4$, the level of the output voltage $V_{OUT}$ is boosted to the level of the analog voltage $V_{DAC}$. In more detail, in step S804, the first switch SW1, the third switch SW3 and the seventh switch SW7 are turned off and the second switch SW2, the fourth switch SW4, the eighth switch SW8 and the ninth switch SW9 are turned on, so that the OPA 503 functions as a unit gain amplifier.

Thus, the system voltage $V_{DD}$ is provided to the gate of the PMOS transistor $P_1$, and therefore the gate-source voltage Vgs2 of the PMOS transistor $P_1$ is smaller than zero to turn off the PMOS transistor $P_1$ in the fourth duration $T_4$. Meanwhile, since the load capacitor $C_L$ has the level of the sharing voltage $V_{EQ}$ due to discharging in the third duration $T_3$, thus in the fourth duration $T_4$, the OPA 503 reduces the voltage level thereof merely from the level of the sharing voltage $V_{EQ}$ down to the analog voltage $V_{DAC}$ in the low voltage level. In this way, the above-described steps S801-S804 are repeatedly and cyclically, the application device using the analog power-saving apparatus for sharing electric charges and the method thereof provided by the present invention can entirely achieve the power-saving goal.

Note that in another embodiment of the present invention, the storing/sharing capacitor $C_{EQ}$ employed by the analog power-saving apparatus 500 for sharing electric charges in the above-described embodiment can be alternatively implemented by a common power supply with electric charges-storing function, which thereby provides a voltage similar to the sharing voltage $V_{EQ}$. In this way, the analog power-saving apparatus 500 for sharing electric charges works to achieve the technical effect of the present invention as well.

In summary, the key feature of the analog power-saving apparatus and the method thereof for sharing electric charges rests in an analog judgment mechanism, by which during a duration when the energy-storing unit distributes the stored electric charges thereof to the load capacitor and the electric charges stored in the energy-storing unit are less than the electric charges stored in the load capacitor, the path for distributing electric charges from the energy-storing unit to the load capacitor is blocked; after the load capacitor releases the electric charges thereof to the energy-storing unit for storage, the amount of electric charges of the load capacitor after discharge are controlled to be not less than the amount of electric charges stored in the energy-storing unit after storage and the output voltage must be greater than or equal to the analog voltage. In this way, the analog power-saving apparatus and the method thereof for sharing electric charges of the present invention can solve the problem of the negative effect caused by the conventional analog power-saving apparatus for sharing electric charges which employs a judgment mechanism of the application device's digital system the conventional power-saving apparatus is applied to.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An analog power-saving apparatus for sharing electric charges, comprising:
    a digital-to-analog converter, for producing an analog voltage according to a digital signal;
    an operational amplifier, comprising a first input terminal for receiving the analog voltage and a second input terminal coupled to an output terminal of the operational amplifier;
    a load capacitor, comprising a first terminal coupled to the output terminal of the operational amplifier for outputting an output voltage and a second terminal coupled to a reference level;
    an energy-storing unit, comprising a first terminal for outputting a sharing voltage and a second terminal coupled to the reference level; and
    a control module, coupled to the output terminal of the operational amplifier and the first terminals of the energy-storing unit and the load capacitor for receiving a comparison signal produced by the output terminal of the operational amplifier and thereby controlling electric charges-sharing states between the load capacitor and the energy-storing unit,
    wherein the control module controls the electric charges-sharing states between the load capacitor and the control module in analog mode,
    during a duration when the energy-storing unit needs to distribute stored electric charges thereof to the load capacitor and electric charges stored in the energy-storing unit are less than electric charges stored in the load capacitor, the control module keeps the energy-storing unit from distributing electric charges to the load capacitor, and
    after the load capacitor discharges electric charges thereof to the energy-storing unit for storage, the control module controls an amount of electric charges of the load capacitor after discharge to be not less than an amount of electric charges stored in the energy-storing unit after storage.

2. The analog power-saving apparatus for sharing electric charges according to claim 1, further comprising:
- a first switch, comprising a first terminal coupled to the second input terminal of the operational amplifier and a second terminal coupled to the first terminal of the load capacitor; and
- a second switch, comprising a first terminal coupled to the second input terminal and a second terminal coupled to the output terminal of the operational amplifier.

3. The analog power-saving apparatus for sharing electric charges according to claim 2, wherein the control module is employed such that in a first duration when the analog voltage is higher than the output voltage and an amount of electric charges stored in the energy-storing unit are greater than an amount of electric charges stored in the load capacitor, the control module makes the comparison signal to be a high voltage level, so that electric charges stored in the energy-storing unit are distributed to the load capacitor, and in a second duration, a level of the output voltage is increased to a level of the analog voltage; in a third duration, when the analog voltage is lower than the output voltage and the electric charges stored in the load capacitor are greater than the electric charges stored in the energy-storing unit, the control module makes the comparison signal to be a low voltage level, so that the electric charges to be released in the load capacitor are stored in the energy-storing unit, but an amount of the electric charges stored in the load capacitor after discharge are required to be not less than an amount of the electric charges stored in the energy-storing unit after storage, and in a fourth duration the level of the output voltage is reduced to the level of the analog voltage,
wherein the first switch is turned on in the first duration and the third duration and the second switch is turned on in the second duration and the fourth duration.

4. The analog power-saving apparatus for sharing electric charges according to claim 3, wherein the control module comprises:
- a control signal generating unit, for generating a first control signal and a second control signal according to the comparison signal in the high voltage level and the comparison signal in the low voltage level;
- a control voltage generating unit, for respectively receiving the output voltage and the sharing voltage and generating a control voltage according to the first control signal and the second control signal; and
- a switch unit, comprising a first terminal coupled to the output terminal of the operational amplifier, a second terminal for receiving the sharing voltage, a third terminal for receiving the control voltage and an output terminal for generating the output voltage, wherein the switch unit, according to the control voltage, is employed such that in the first duration, when the analog voltage is higher than the output voltage and an amount of the electric charges stored in the energy-storing unit is greater than an amount of the electric charges stored in the load capacitor, the switch unit distributes the electric charges stored in the energy-storing unit to the load capacitor, and in a second duration, the switch unit increases the level of the output voltage to the level of the analog voltage; in a third duration, when the analog voltage is lower than the output voltage and an amount of the electric charges stored in the load capacitor are greater than an amount of the electric charges stored in the energy-storing unit, the switch unit stores the electric charges to be released in the load capacitor into the energy-storing unit, but the electric charges stored in the load capacitor after discharge are required not less than the electric charges stored in the energy-storing unit after storage, and in a fourth duration the switch unit reduces the level of the output voltage to the level of the analog voltage.

5. The analog power-saving apparatus for sharing electric charges according to claim 4, wherein the control signal generating unit comprises:
- a third switch, comprising a first terminal for receiving the comparison signal in the high voltage level or the low voltage level;
- a fourth switch, comprising a first terminal coupled to a system voltage and a second terminal coupled to the second terminal of the third switch;
- a first inverter, comprising an inverting input terminal coupled to the second terminal of the fourth switch and an output terminal for generating the second control signal; and
- a second inverter, comprising an inverting input terminal coupled to the output terminal of the first inverter and an output terminal for generating the first control signal,
wherein the third switch is turned on in the first duration and the third duration and the fourth switch is turned on in the second duration and the fourth duration.

6. The analog power-saving apparatus for sharing electric charges according to claim 5, wherein the control voltage generating unit comprises:
- a fifth switch and a sixth switch, respectively comprising a first terminal, wherein the first terminals of the fifth switch and the sixth switch are respectively coupled to the first terminals of the load capacitor and the energy-storing unit;
- an NMOS transistor, comprising a gate coupled to the second terminals of the fifth switch and the sixth switch and a drain coupled to the system voltage;
- a constant-current source, coupled between the source of the NMOS transistor and the reference level;
- a seventh switch, comprising a first terminal coupled to the source of the NMOS transistor;
- an eighth switch, comprising a first terminal coupled to the system voltage and a second terminal coupled to the second terminal of the seventh switch for producing the control voltage,
wherein the on or off state of the fifth switch and the sixth switch is respectively decided by the first control signal and the second control signal, and the seventh switch is turned on in the first duration and the third duration and the eighth switch is turned on in the second duration and the fourth duration.

7. The analog power-saving apparatus for sharing electric charges according to claim 6, wherein when both the first control signal and the second control signal take a high voltage level, the fifth switch and the sixth switch are turned on; otherwise, the fifth switch and the sixth switch are turned off.

8. The analog power-saving apparatus for sharing electric charges according to claim 6, wherein the switch unit comprises:
- a ninth switch, comprising a first terminal coupled to the output terminal of the operational amplifier and a second terminal coupled to the first terminal of the load capacitor; and
- a PMOS transistor, comprising a gate for receiving the control voltage, a first drain/source coupled to the first terminal of the energy-storing unit and a second drain/source coupled to the first terminal of the load capacitor,
wherein the ninth switch is turned on in the second duration and the fourth duration and on or off state of the PMOS transistor is decided according to the control voltage, the output voltage and the sharing voltage.

9. The analog power-saving apparatus for sharing electric charges according to claim 1, wherein the energy-storing unit comprises a storing and sharing capacitor or a power supply having electric charges-storing function.

10. An analog power-saving method for sharing electric charges, suitable for the analog power-saving apparatus for sharing electric charges according to claim 8; the method comprising following steps:

using the output terminal of the operational amplifier to generate the comparison signal in the high voltage level in the first duration when the analog voltage is higher than the output voltage and an amount of the electric charges stored in the energy-storing unit is greater than an amount of the electric charges stored in the load capacitor such that the electric charges stored in the energy-storing unit are distributed to the load capacitor, and in the second duration the level of the output voltage is increased to the level of the analog voltage; and using the output terminal of the operational amplifier to generate the comparison signal in the low voltage level in the third duration when the analog voltage is lower than the output voltage and an amount of the electric charges stored in the load capacitor is greater than an amount the electric charges stored in the energy-storing unit such that the electric charges to be released in the load capacitor are stored in the energy-storing unit, but an amount of the electric charges stored in the load capacitor after discharge are required to be not less than an amount of the electric charges stored in the energy-storing unit after storage, and in the fourth duration the level of the output voltage is reduced to the level of the analog voltage.

11. The analog power-saving method for sharing electric charges according to claim 10, wherein during the first duration further comprises the following steps:

turning on the first switch, the third switch and the seventh switch, and turning off the second switch, the fourth switch, the eighth switch and the ninth switch so that the operational amplifier functions as a comparator to compare the analog voltage with the output voltage to thereby enable the output terminal of the operational amplifier to obtain the comparison signal in the high voltage level;

wherein the first control signal takes the high voltage level and the second control signal takes a low voltage level according to the comparison signal in the high voltage level, so as to turn on the fifth switch and turn off the sixth switch;

wherein the source of the NMOS transistor generates the control voltage according to the output voltage received by the gate of the NMOS transistor; and wherein the PMOS transistor is turned on according to the control voltage received by the gate thereof so as to distribute the electric charges stored in the energy-storing unit to the load capacitor.

12. The analog power-saving method for sharing electric charges according to claim 11, wherein during the second duration further comprises the following steps:

turning off the first switch, the third switch and the seventh switch, and turning on the second switch, the fourth switch, the eighth switch and the ninth switch so as to make the operational amplifier function as a unit gain amplifier; and turning off the PMOS transistor so as to use the unit gain amplifier to increase the level of the output voltage to the level of the analog voltage.

13. The analog power-saving method for sharing electric charges according to claim 12, wherein during the third duration further comprises the following steps:

turning on the first switch, the third switch and the seventh switch, and turning off the second switch, the fourth switch, the eighth switch and the ninth switch so that the operational amplifier functions as a comparator to compare the analog voltage with the output voltage to enable the output terminal of the operational amplifier to obtain the comparison signal in the low voltage level;

wherein the first control signal takes the low voltage level and the second control signal takes the high voltage level so as to turn off the fifth switch and turn on the sixth switch according to the comparison signal in the low voltage level;

wherein the source of the NMOS transistor generates the control voltage according to the sharing voltage received by the gate of the NMOS transistor; and wherein the PMOS is turned on according to the control voltage received by the gate of the PMOS so as to store the electric charges to be released in the load capacitor into the energy-storing unit, but an amount of the electric charges stored in the load capacitor after discharge is required to be not less than an amount of the electric charges stored in the energy-storing unit after storage; otherwise, the PMOS transistor is turned off.

14. The analog power-saving method for sharing electric charges according to claim 13, wherein during the third duration further comprises the following steps:

changing the comparison signal at the output terminal of the operational amplifier from the low voltage level to the high voltage level and turning off the PMOS transistor during the releasing electric charges by load capacitor to the energy-storing unit, when the analog voltage is greater than the output voltage.

15. The analog power-saving method for sharing electric charges according to claim 14, wherein during the fourth duration further comprises the following steps:

turning off the first switch, the third switch and the seventh switch, and turning on the second switch, the fourth switch, the eighth switch and the ninth switch so as to make the operational amplifier function as a unit gain amplifier; and turning off the PMOS transistor so as to use the unit gain amplifier to reduce the level of the output voltage to the level of the analog voltage.

* * * * *